(12) United States Patent
Huang et al.

(10) Patent No.: US 7,812,422 B2
(45) Date of Patent: Oct. 12, 2010

(54) FILM TYPE PACKAGE FOR FINGERPRINT SENSOR

(75) Inventors: Ming-Liang Huang, Tainan (TW); Yao-Jung Lee, Tainan (TW); Ming-Hsun Li, Tainan (TW)

(73) Assignee: Chipmos Technologies Inc., Hsinchu (TW)

( * ) Notice: Subject to any disclaimer, the term of this patent is extended or adjusted under 35 U.S.C. 154(b) by 837 days.

(21) Appl. No.: 11/790,827

(22) Filed: Apr. 27, 2007

(65) Prior Publication Data

US 2008/0187191 A1    Aug. 7, 2008

(30) Foreign Application Priority Data

Jan. 2, 2007    (TW) .............................. 96100103 A

(51) Int. Cl.
H01L 31/203    (2006.01)
(52) U.S. Cl. .............................. 257/433; 257/E33.072
(58) Field of Classification Search .................. 257/226, 257/232, 234, 254, 433, E33.072
See application file for complete search history.

(56) References Cited

U.S. PATENT DOCUMENTS

| 6,682,981 B2 * | 1/2004 | Leedy | 438/342 |
|---|---|---|---|
| 2003/0215117 A1 * | 11/2003 | Hata | 382/124 |
| 2005/0259853 A1 * | 11/2005 | Miyai et al. | 382/124 |
| 2006/0006487 A1 * | 1/2006 | Chen et al. | 257/433 |
| 2006/0083411 A1 * | 4/2006 | Benkley | 382/124 |
| 2006/0214294 A1 * | 9/2006 | Fukasawa | 257/738 |
| 2007/0086634 A1 * | 4/2007 | Setlak et al. | 382/128 |
| 2007/0246786 A1 * | 10/2007 | Melzak et al. | 257/414 |
| 2008/0085038 A1 * | 4/2008 | Huang et al. | 382/124 |
| 2008/0211048 A1 * | 9/2008 | Rolston et al. | 257/433 |
| 2008/0309459 A1 * | 12/2008 | Bolis et al. | 340/5.83 |
| 2009/0184408 A1 * | 7/2009 | Okada et al. | 257/680 |

FOREIGN PATENT DOCUMENTS

TW    I243437    11/2005

* cited by examiner

Primary Examiner—Nathan W Ha
(74) Attorney, Agent, or Firm—WPAT, P.C.; Anthony King

(57) ABSTRACT

A thin-film fingerprint sensor package primarily comprises a fingerprint sensor chip, a plurality of bumps, a wiring film, an encapsulant and a metal base to mechanically hold the fingerprint sensor chip. A sensing area is formed on the active surface of the fingerprint sensor chip. The bumps are disposed on the active surface. The wiring film has an opening to expose the sensing area and comprises a plurality of leads bonded to the bumps. The wiring film further has a ground lead electrically connecting the fingerprint sensor chip to the metal base. Therefore, the fingerprint sensor package can provide ESD protection during fingerprint recognition to avoid the damage of the fingerprint sensor chip.

13 Claims, 5 Drawing Sheets

FILM TYPE PACKAGE FOR FINGERPRINT SENSOR

FIELD OF THE INVENTION

The present invention relates to a fingerprint sensor package, especially, to a film-type fingerprint sensor package.

BACKGROUND OF THE INVENTION

There are many electronic devices to enhance our working efficiencies every day such as cellular phones, notebook computers, personal digital assistants (PDA), etc. Since the competitions among the same businesses are getting intense, trade secrets have drawn many attentions these days. Therefore, there are more and more electronic devices have included security screening devices such as fingerprint sensors to ensure the trade secrets will not be leaked out to the opponents, and only the owners of the electronic devices can initiate the electronic devices and access to the information inside the electronic devices through the scanning of their fingerprints. Moreover, with the fingerprint sensors added to these electronic devices, the market values of these electronic devices will be higher.

So far fingerprint sensors are fabricated by IC semiconductor processes and then assembled. The packages for fingerprint sensors are different from the conventional IC packages where the fingerprint sensor packages have exposed sensing areas on chips for fingerprint recognition. However, when sliding the fingers for fingerprint recognitions, static electricity will come along and accumulate in the fingerprint sensor package. When static electricity is discharged, the fingerprint sensor chip or the other components will be damaged.

As shown in FIG. 1 and FIG. 2, a conventional fingerprint sensor package 100 includes a substrate 110, a fingerprint sensor chip 120, a plurality of bonding wires 130 and an encapsulant 140. A sensing area 123 is formed on the active surface 121 of the fingerprint sensor chip 120, the back surface 122 of the fingerprint sensor chip 120 is attached to the top surface 111 of the substrate 110. The fingerprint sensor chip 120 is electrically connected to the substrate 110 by a plurality of bonding wires 130. The encapsulant 140 is formed on the top surface 111 of the substrate 110 to encapsulate the bonding wires 130 and the fingerprint sensor chip 120 with the sensing area 123 exposed from the encapsulant 140. A plurality of external terminals 150 such as solder balls are disposed on the bottom surface 112 of the substrate 110 so that the fingerprint sensor package 100 can mechanically and electrically connect to an external printed circuit board by SMT, not shown in the figures, where all the mechanical and electrical connections are concentrated at the bottom surface 112 of the substrate 110 by the external terminals 150. Therefore, the overall thickness of the fingerprint sensor package 100 can not be reduced due to the heights of the external terminals 150 after SMT. Moreover, during fingerprint recognition, the fingers will exert extra stresses on the fingerprint sensor chip 120 where the extra stresses will transmit to the substrate 110 to break the external terminals 150 leading to electrically open.

In Taiwan R.O.C Patent No. 1243437, entitled "sliding type thin fingerprint sensor package", a fingerprint sensor package is revealed. The back surface and the sides of the fingerprint sensor chip are encapsulated by a molding compound, then a flexible printed circuit board is attached to the conductive components disposed on the active surface of the fingerprint sensor chip, i.e., the encapsulation of the fingerprint sensor chip is done first then the attachment of the flexible printed circuit board is followed. However, there is a risk of contamination of the sensing area during encapsulation, moreover, the existing packaging processes and equipment can not be implemented.

SUMMARY OF THE INVENTION

The main purpose of the present invention is to provide a thin-film fingerprint sensor package where the static electricity, caused by sliding the fingers during fingerprint recognition, can be safely discharged by a ground lead of a wiring film electrically connecting the chip to the metal base to achieve the protection of electrostatic discharge, ESD, and to avoid the fingerprint sensor chip from damages.

According to the present invention, a thin-film fingerprint sensor package primarily comprises a fingerprint sensor chip, a plurality of bumps, a wiring film, an encapsulant and a metal base. A sensing area is formed on an active surface of the fingerprint sensor chip, and the bumps are disposed on the active surface. The wiring film has an opening to expose the sensing area. Furthermore, the wiring film has a plurality of leads having a plurality of inner ends electrically connected to the bumps. The bumps are encapsulated by the encapsulant. The fingerprint sensor chip is mechanically held by the metal base. In addition, the wiring film has a ground lead electrically connecting the fingerprint sensor chip to the metal base.

DETAIL DESCRIPTION OF THE INVENTION

Please refer to the attached drawings, the present invention will be described by means of embodiment(s) below.

Figure 1:
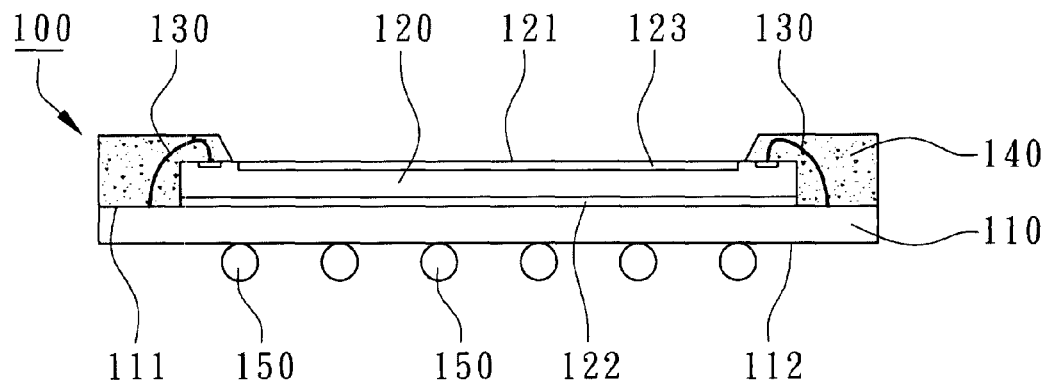
FIG. 1 shows a cross-sectional view of a conventional fingerprint sensor package.
Figure 2:
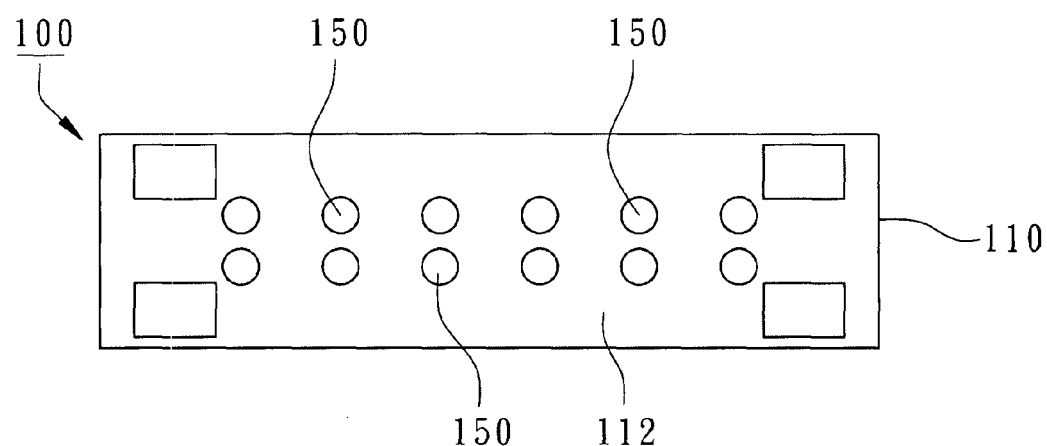
FIG. 2 shows a bottom view of a conventional fingerprint sensor package.
Figure 3:
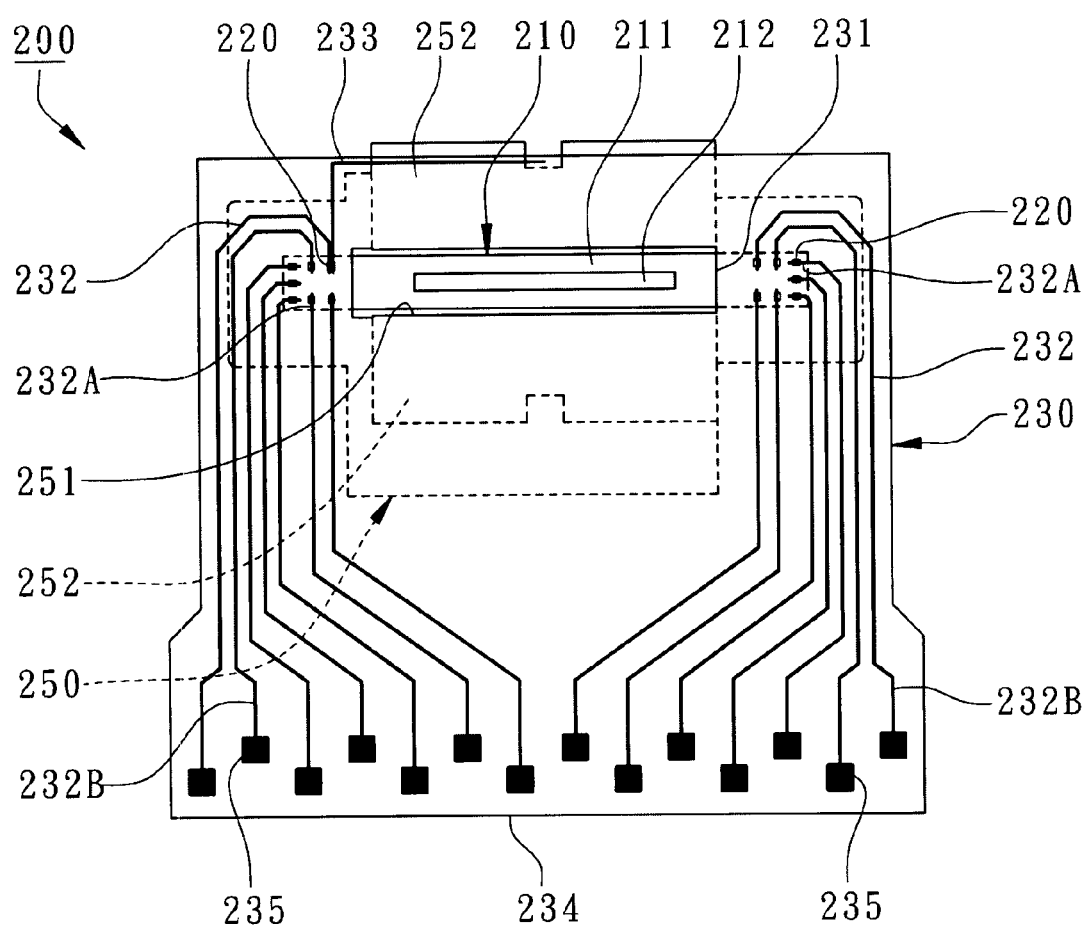
FIG. 3 shows a top view of the thin-film fingerprint sensor package according to the first embodiment of the present invention.
Figure 5:
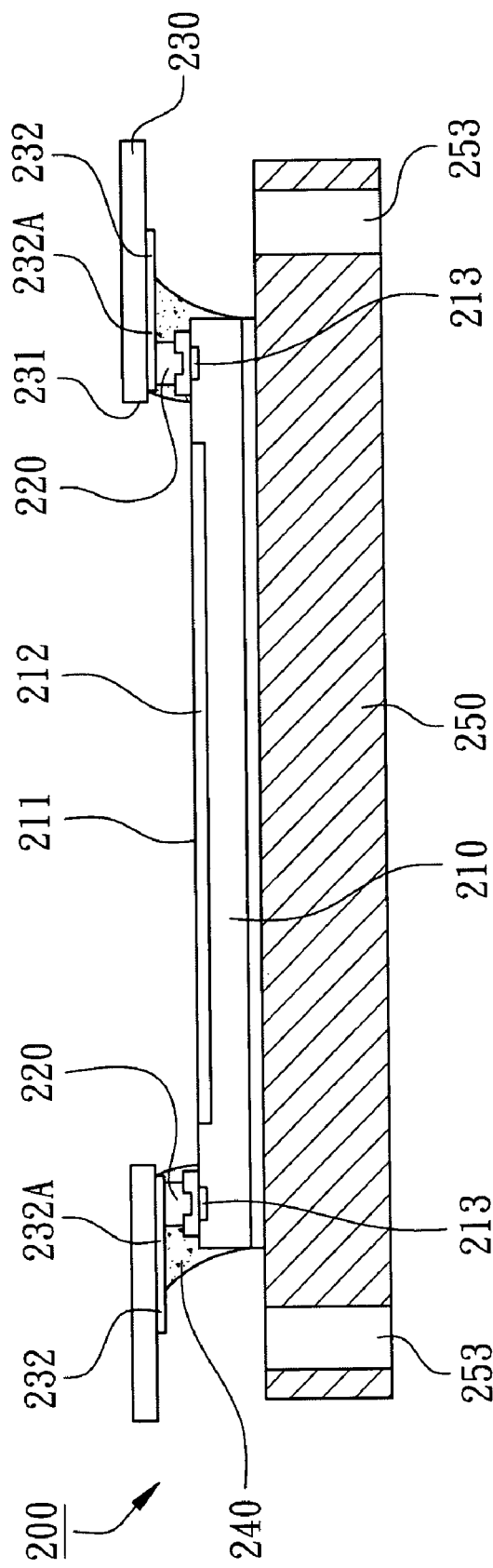
FIG. 5 shows a cross-sectional view of the thin-film fingerprint sensor package according to the first embodiment of the present invention.

According to the first embodiment of the present invention, as shown in FIG. 3 and FIG. 5, a thin-film fingerprint sensor package 200 primarily comprises a fingerprint sensor chip 210, a plurality of bumps 220, a wiring film 230, an encapsulant 240 and a metal base 250 where the wiring film 230 is the chip carrier for the fingerprint sensor chip 210 during reel-to-reel packaging processes. The fingerprint sensor chip 210 is electrically connected to the wiring film 230 by the bumps 220 or/and the others, such as ACF (antisotropic conductive film) or NCP (non-conductive paste).

A sensing area 212 is formed on the active surface 211 of the fingerprint sensor chip 210. Normally, there are light-sensing components, RF sensing components, or sensing components which can sense pressures, temperatures, or capacitance formed in the sensing area 212 for fingerprint recognition. As shown in FIG. 3, the sensing area 212 is a strip or other shapes so that with fingers dynamically sliding or statically pressing on the sensing area 212, the fingerprints can be sensed and recognized. Moreover, the fingerprint sensor chip 210 has a plurality of bonding pads 213 formed on the active surface 211 for connecting the bumps 220.

The bumps 220 are disposed on the active surface 211 and are electrically connected to the corresponding bonding pads 213 so as to extrude from the active surface 211 where the bumps 220 can be made of gold, copper, nickel, aluminum, or solder and can be formed by electroplating or wire bonding.

As shown in FIG. 3, the wiring film 230 has an opening 231 to expose the sensing area 212 and a plurality of leads 232 where the leads 232 have a plurality of inner ends 232A bonded to the bumps 220 by ultrasonic bonding, thermal pressing, or other flip chip bonding technologies. Moreover, the leads 232 further have a plurality of outer ends 232B rerouted to a same extension 234 of the wiring film 230 where the extension 234 is flexible and is outside the metal base 250.

As shown in FIG. 5, the bumps 221 are encapsulated by an encapsulant 240 where the encapsulant 240 can be a potting resin.

Figure 4:
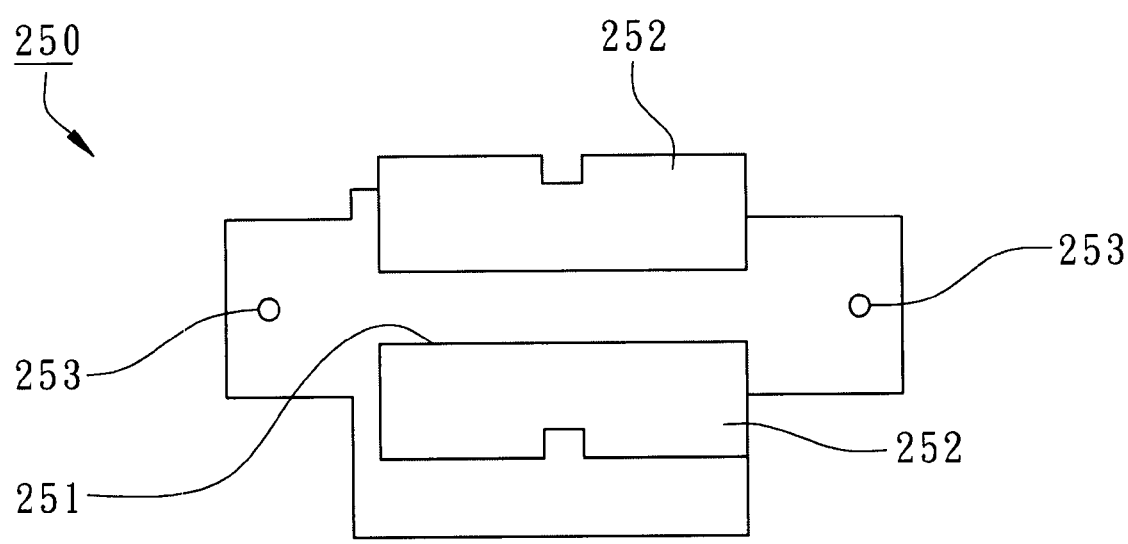
FIG. 4 shows a top view of the metal base of the thin-film fingerprint sensor package according to the first embodiment of the present invention.

As shown in FIG. 3 and FIG. 4, the metal base 250 has a slot 251 where the fingerprint sensor chip 210 is mechanically held in the slot 251 from both sides of the fingerprint sensor chip 210. In the present embodiment, the metal base 250 has a plurality of extruded holders 252 to form the slot 251 where the extruded holders 252 are rectangular. The fingerprint sensor chip 210 is mechanically held by these extruded holders 252. In the present embodiment, the metal base 250 has a plurality of jointing holes 253 to hold the fingerprint sensor package 200 at any appropriate location of an electronic device to keep the good horizontal alignment of the sensing area 212.

The wiring film 230 further has at least a ground lead 233 electrically connecting at least a bump 220 of the fingerprint sensor chip 210 to the metal base 250 to discharge the static electricity caused by sliding the fingers to form a circuit. Normally, the resistivity values of the ground lead 233 is greater than the leads 232 for safely electrostatic discharging. Preferably, the wiring film 230 has a portion attached to the extruded holders 252 so that the ground lead 233 electrically connects the metal base 250. In the present embodiment, one end of the ground lead 233 is extended toward the extruded holder 252. The ground lead 233 electrically connects the extruded holder 252 by conductive paste or solder since there is an indentation in the portion of the wiring film 230 to expose the one end of the ground lead 233 and some of the extruded holder 252 (as shown in FIG. 3). The other end of the ground lead 233 is connected to a dummy bump 220 disposing on the active surface 211 of the fingerprint sensor chip 210.

As shown in FIG. 3, the opening 231 of the wiring film 230 can be a slot. In the present embodiment, the wiring film 230 is parts of a COF (Chip-On-Film) tape. Preferably, the length of the opening 231 is smaller than the one of the active surface 211 of the fingerprint sensor chip 210 but is greater than the length of the sensing area 212. The width of the wiring film 230 is greater than the one of the sensing area 212 of the active surface 211 of the fingerprint sensor chip 210 to partially expose the metal base 250. Moreover, the inner ends 232A of the leads 232 are adhered to the dielectric layers of the wiring film 230 to eliminate the shaking and the shifting of the leads 232 during flip-chip bonding or ILB (inner lead bonding) processes. However, in other embodiments, the length of the opening 231 can be equal to or greater than the length of the active surface 211 of the fingerprint sensor chip 210.

In the present embodiment, each lead 232 has an outer ends 232B connected with an outer fingers 235. Preferably, the outer fingers 235 are arranged in staggers to increase the pitches of the outer fingers 235 and to avoid shorts between the outer fingers 235. Moreover, the outer fingers 235 can electrically connect to an external printed circuit board or a component inside an electronic device, not shown in the figure, by anisotropic conductive film, ACF, solder-paste soldering, or connectors.

When fingers dynamically sliding or statically pressing on the sensing area 212 for fingerprint recognition, the generated static electricity will be safely discharged from the active surface 211 of the fingerprint sensor chip 210 through the ground leads 233 and the metal base 250 to the external environment without damaging the leads 232 and the fingerprint sensor chip 210. Therefore, during the fingerprint recognition, the thin-film fingerprint sensor package 200 has ESD protection to avoid damages of the fingerprint sensor chip 210.

Figure 6:
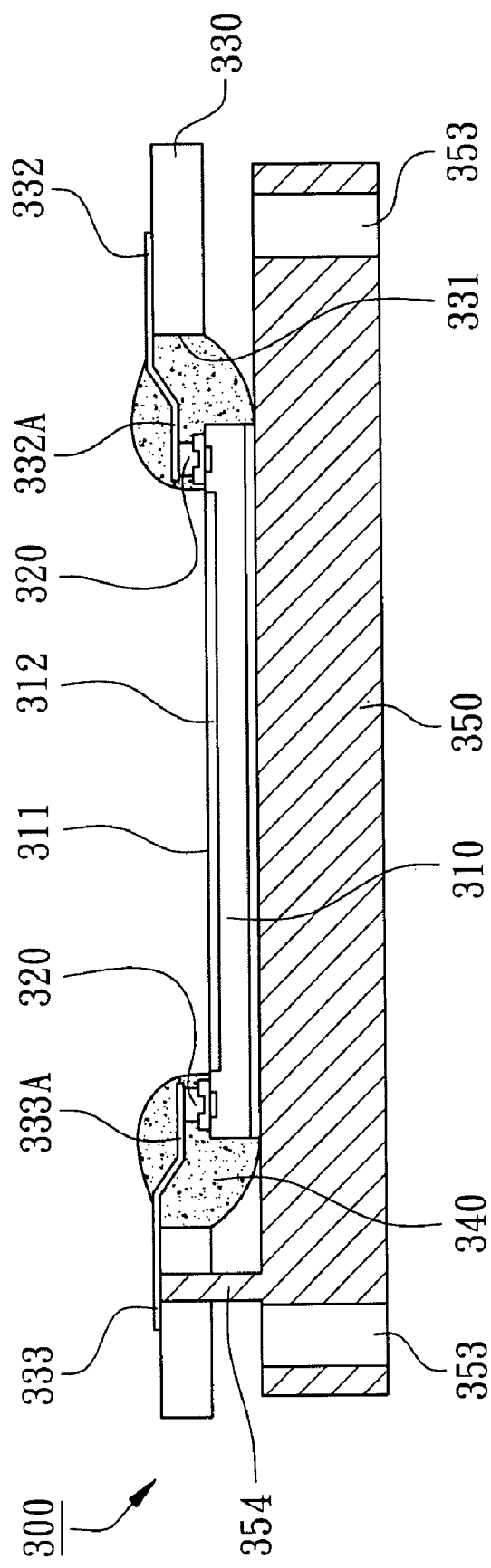
FIG. 6 shows a cross-sectional view of the thin-film fingerprint sensor package according to the second embodiment of the present invention.

According to the second embodiment of the present invention, as shown in FIG. 6, another thin-film fingerprint sensor package 300 primarily comprises a fingerprint sensor chip 310, a plurality of bumps 320, a wiring film 330, an encapsulant 340, and a metal base 350. The fingerprint sensor chip 310 has a sensing area 312 included in the active surface 311, and the bumps 320 are disposed on the active surface 311.

The wiring film 330 has an opening 331 to expose the sensing area 312 where the wiring film 330 has a plurality of leads 332 and at least a ground lead 333. The inner ends 332A of the leads 332 and the inner ends 333A of the ground lead 333 are bonded to the corresponding bumps 320. In the present embodiment, the wiring film 330 can be parts of a TCP (Tape Carrier Package) tape where the inner leads 332A of the leads 332 and the inner leads 333A of the ground lead 333 are extended and suspended over the slot 331. The encapsulant 340 encapsulates the bumps 320. The fingerprint sensor chip 310 is mechanically held by the metal base 350. In the present embodiment, the metal base 350 has a plurality of jointing holes 353 to hold the fingerprint sensor package 300 at any appropriate location of an electronic device to keep the good horizontal alignment of the sensing area 312. In the present embodiment, the metal base 350 further has an electrostatic discharging post 354 penetrating the wiring film 330. Moreover, the electrostatic discharging post 354 of the metal base 350 electrically connects the ground lead 333, and then to the fingerprint sensor chip 310 to form an electrical path to discharge the internal static electricity to external environment. Therefore, the fingerprint sensor package 300 has the function of ESD protection during fingerprint recognition.

The above description of embodiments of this invention is intended to be illustrative and not limiting. Other embodiments of this invention will be obvious to those skilled in the art in view of the above disclosure.

What is claimed is:

1. A thin-film fingerprint sensor package comprising:
   a fingerprint sensor chip having an active surface including a sensing area;
   a plurality of bumps disposed on the active surface;
   a wiring film having an opening exposing the sensing area and a plurality of leads, wherein the leads have a plurality of inner ends bonded to the bumps;
   an encapsulant encapsulating the bumps; and
   a metal base mechanically holding the fingerprint sensor chip;
   wherein the wiring film further has at least a ground lead electrically connecting the fingerprint sensor chip to the metal base.

2. The thin-film fingerprint sensor package of claim 1, wherein the metal base has a holding slot to mechanically hold the fingerprint sensor chip.

3. The thin-film fingerprint sensor package of claim 2, wherein the metal base has a plurality of extruded holders to form the slot.

4. The thin-film fingerprint sensor package of claim 3, wherein the wiring film has a portion attached to the extruded holders so that the ground lead electrically connects the metal base.

5. The thin-film fingerprint sensor package of claim 1, wherein the leads have a plurality of outer ends rerouted to a same extension of the wiring film.

6. The thin-film fingerprint sensor package of claim 5, wherein each outer end is connected with an outer finger.

7. The thin-film fingerprint sensor package of claim 1, wherein the encapsulant is a potting resin.

8. The thin-film fingerprint sensor package of claim 1, wherein the width of the opening of the wiring film is greater than the one of the sensing area of the fingerprint sensor chip to expose the metal base.

9. The thin-film fingerprint sensor package of claim 1, wherein the wiring film is parts of a COF (Chip-On-Film) tape.

10. The thin-film fingerprint sensor package of claim 6, wherein the opening of the tin-film circuit is a slot, wherein the length of the opening is smaller than the one of the active surface of the fingerprint sensor chip but is greater than the one of the sensing area.

11. The thin-film fingerprint sensor package of claim 1, wherein the wiring film is parts of a TCP (Tape Carrier Package) tape.

12. The thin-film fingerprint sensor package of claim 1, further comprising at least a dummy bump disposing on the active surface and bonding to the ground lead.

13. The thin-film fingerprint sensor package of claim 1, wherein the bumps are selected from a group consisting of gold, copper, nickel, aluminum, and solder.

* * * * *